United States Patent
Lin et al.

(10) Patent No.: US 7,617,475 B2
(45) Date of Patent: Nov. 10, 2009

(54) METHOD OF MANUFACTURING PHOTOMASK AND METHOD OF REPAIRING OPTICAL PROXIMITY CORRECTION

(75) Inventors: Ling-Chieh Lin, Taichung County (TW); Chien-Fu Lee, Taipei (TW); I-Hsiung Huang, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 444 days.

(21) Appl. No.: 11/559,107

(22) Filed: Nov. 13, 2006

(65) Prior Publication Data

US 2008/0113274 A1    May 15, 2008

(51) Int. Cl.
*G06F 17/50* (2006.01)
(52) U.S. Cl. .................................................. 716/19
(58) Field of Classification Search ................ 716/19
See application file for complete search history.

(56) References Cited

U.S. PATENT DOCUMENTS

| | | | |
|---|---|---|---|
| 6,350,977 B2* | 2/2002 | Taoka | 250/204 |
| 6,904,587 B2* | 6/2005 | Tsai et al. | 716/19 |
| 7,017,141 B2* | 3/2006 | Anderson et al. | 716/19 |

* cited by examiner

*Primary Examiner*—Jack Chiang
*Assistant Examiner*—Brandon W Bowers
(74) *Attorney, Agent, or Firm*—J.C. Patents

(57) ABSTRACT

A method of manufacturing a photomask is described. The graphic data of the photomask are provided, and than an optical proximity correction is performed to the graphic data. A process rule check is then performed to the graphic data with the optical proximity correction. When at least one failed pattern not passing the process rule check is found in the graphic data, a repair procedure is performed only to the failed pattern so that the failed pattern can pass the process rule check. The patterns of the photomask are then formed according to the corrected and repaired graphic data.

14 Claims, 2 Drawing Sheets

METHOD OF MANUFACTURING PHOTOMASK AND METHOD OF REPAIRING OPTICAL PROXIMITY CORRECTION

BACKGROUND OF THE INVENTION

1. Field of Invention

This invention relates to a manufacturing method of a tool used in an integrated circuit (IC) process, and more particularly to a method of manufacturing a photomask and a method of repairing an optical proximity correction (OPC) to the graphic data of a photomask.

2. Description of Related Art

After the linewidth of IC process drops to the deep sub-micro level, the control on the critical dimension (CD) of each patterned layer of an integrated circuit becomes more and more important. When the linewidth drops to one half or less of the wavelength of the light source for exposure, optical proximity correction is required for the patterns of the photomask to reduce the deviation of the critical dimension. The optical proximity correction includes, for example, adding serifs or a hammerhead at an end of a bar-like pattern, making protrusions and indents at the edges of a pattern, adding an assist line beside a pattern, and so forth.

In the conventional method of manufacturing a photomask with OPC, an OPC recipe is applied to correct the patterns in the graphic data of the photomask after the graphic patterns are provided, and then the graphic data with OPC is subjected to a process rule check (PRC), which utilizes computer simulations to predict whether the patterns transferred onto the wafer meet the requirements of the process or not. If one or more patterns cannot pass the process rule check, another OPC recipe is applied to correct all patterns in the original graphic data, and then another process rule check is performed. However, for the graphic data system (GDS) file of a photomask used in advanced IC processes easily has a size up to hundreds of gigabytes, the conventional method is quite time-consuming.

SUMMARY OF THE INVENTION

Accordingly, this invention provides a method of repairing optical proximity correction (OPC), which adjusts only the failed patterns that cannot pass the PRC.

This invention also provides a method of manufacturing a photomask, which utilizes the above OPC repairing method of this invention to shorten the period needed for manufacturing the photomask.

According to an embodiment, the method of manufacturing a photomask of this invention may include the following steps, the photomask being used in an integrated circuit (IC) process to define a first patterned layer of the IC. The graphic data of the photomask are provided, and then an optical proximity correction is performed to the graphic data. A process rule check is then performed to the graphic data with the OPC. When at least one failed pattern not passing the process rule check is found, a repair procedure is performed only to the failed pattern so that the failed pattern can pass the process rule check. The patterns of the photomask are then formed according to the corrected and repaired graphic data that have been subjected to the OPC and the repair.

In an embodiment, the repair procedure includes the steps below. The graphic data of parts of an upper patterned layer and a lower patterned layer that are respectively over and under the first patterned layer in the integrate circuit and relate to the first patterned layer are retrieved, wherein the parts of the upper and lower patterned layers correspond to the failed pattern. The arrangement of at least one adjacent pattern neighboring to the failed pattern in the integrated circuit is check, and then a critical dimension and/or a position of the failed pattern is adjusted based on the graphic data of the parts of the upper and lower patterned layers and the arrangement of the at least one adjacent pattern. The adjustment to the critical dimension preferably does not exceed 30% thereof. It is particularly noted that the term "and/or" means "and" or "or" in the whole specification and the claims of this invention.

In an embodiment, in adjusting the critical dimension and/or the position of the failed pattern, a distance between calculated projection contours of the failed pattern and the at least one adjacent pattern may be considered. When there is a plurality of adjacent patterns, the distances at all angles between the calculated projection contour of the failed pattern and those of the adjacent patterns may be considered. When the graphic data includes a plurality of contact hole patterns, the adjustment to a critical dimension of a failed contact hole pattern not passing the process rule check may include increasing the x-directional critical dimension thereof but decreasing the y-directional one thereof, or increasing the y-directional critical dimension thereof but decreasing the x-directional one thereof. The adjustment to the x- or y-directional critical dimension is preferably within the range of ±30% thereof. The upper and lower patterned layers each may include a plurality of conductive lines.

In an embodiment, the IC process may further include using another photomask to form a second patterned layer at the same level of the first patterned layer of the integrated circuit, wherein the at least one adjacent pattern includes a part of the second patterned layer. The repair procedure may further include retrieving the graphic data of the part of the second patterned layer for deriving the arrangement of the at least one adjacent pattern. In adjusting the critical dimension and/or the position of the failed pattern, a distance between calculated projection contours of the failed pattern and the at least one adjacent pattern may be considered. When there is a plurality of adjacent patterns, the distances at all angles between the calculated projection contour of the failed pattern and those of the adjacent patterns may be considered.

In one embodiment, the first patterned layer has a plurality of S/D contact holes therein, the graphic data of the photomask include a plurality of S/D contact hole patterns, the lower patterned layer includes a plurality of active areas, the upper patterned layer includes a plurality of interconnect lines, and the second patterned layer includes a plurality of gates. The adjustment to a critical dimension of an S/D contact hole pattern not passing the process rule check may include increasing the x-directional critical dimension thereof but decreasing the y-directional one thereof, or increasing the y-directional critical dimension thereof but decreasing the x-directional one thereof. The adjustment to the x- or y-directional critical dimension is preferably within the range of ±30% thereof.

In a preferred embodiment, the method of repairing optical proximity correction of this invention is applied to the graphic data of a photomask with OPC, wherein the photomask is used in an IC process to define a patterned layer of the IC and the graphic data include at least one failed pattern not passing a process rule check. The method includes the following steps. The graphic data of parts of an upper patterned layer and a lower patterned layer that are respectively on and over the patterned layer and related to the pattern layer are retrieved, wherein the parts of the upper and lower patterned layers correspond to the failed pattern. The arrangement of at least one adjacent pattern neighboring to the failed pattern in the integrated circuit is checked, and then a critical dimension and/or a position of the failed pattern is adjusted based on the graphic data of the parts of the upper and lower patterned layers and a distance between the calculated projection contours of the failed pattern and the at least one adjacent pattern.

Since the photomask manufacturing method of this invention performs a repair procedure only to the failed patterns not passing the process rule check but not adjust all patterns with another OPC recipe, the design of the photomask can be simplified to shorten the period needed for manufacturing the photomask. Additionally, in an embodiment where a critical dimension and/or a position of a failed pattern are adjusted in the repair procedure, the process margin is increased to improve the product yield.

In order to make the aforementioned and other objects, features and advantages of the present invention comprehensible, a preferred embodiment accompanied with figures is described in detail below.

DESCRIPTION OF EMBODIMENTS

Figure 1:
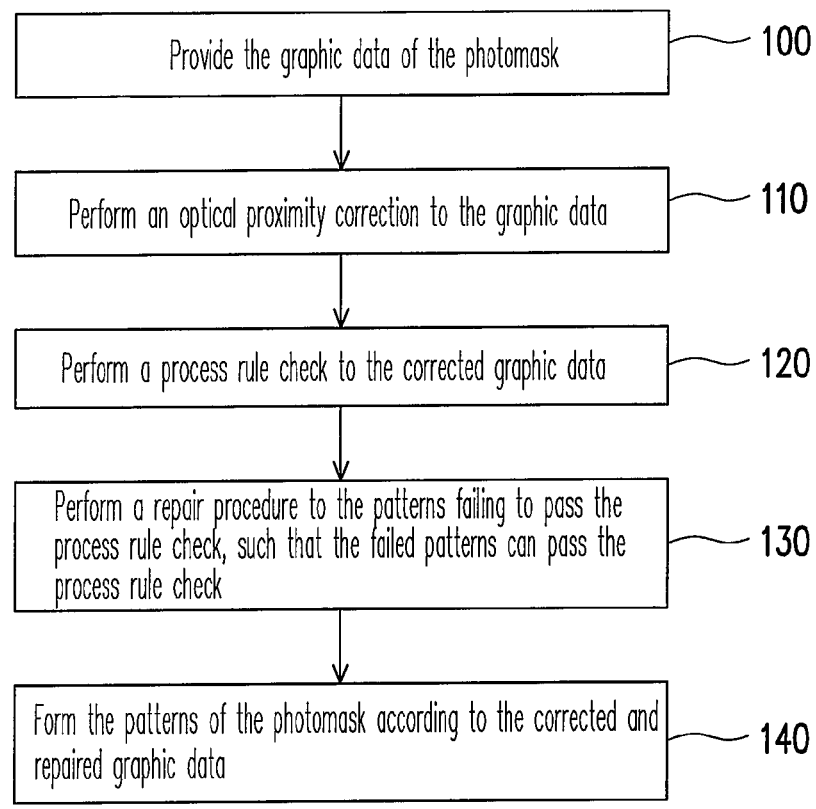
FIG. 1 show a flow chart of a photomask manufacturing method according to an embodiment of this invention.

FIG. 1 shows a flow chart of a photomask manufacturing method according to an embodiment of this invention. The photomask is used in an IC process for defining a patterned layer of the integrated circuit, and the patterned layer may be a dielectric layer having contact holes therein or may include conductive lines. At first, the graphic data of the photomask are provided in step 100, possibly made by an IC designer and stored in a GDS file. Optical proximity correction is then performed to the graphic data in step 110, which may include adding serifs at four corners of a contact hole pattern or adding a hammerhead at an end of a conductive line pattern.

In next step 120, a process rule check is performed to the graphic data with OPC. The process rule check mainly include a lithography rule check (LRC) and a design rule check (DRC). The LRC usually includes using numerical integration of a convolution formula to derive the contours of the photomask patterns projected onto the photoresist layer, so as to check if there is any location beyond the lithographic resolution where adjacent patterns are merged in mistake or a single pattern is broken. A design rule check usually includes predicting whether the patterns transferred onto the wafer can meet the requirements of the circuit design or not, according to the above calculated projection contours of the patterns and the variables in etching and alignment. The requirements include, for example, sufficient widths for conductive lines, sufficient cross-sectional areas for contact plugs, sufficient overlap areas between conductive lines and contact plugs, prevention of erroneous connection between adjacent patterns, due to insufficient etching margin, and so forth. In a case where another photomask is used to define patterns that are at the same level of the patterns defined by the photomask to be manufactured, the requirements may also include prevention of erroneous connection between the patterns defined by the different photomasks due to insufficient alignment/etching margin.

An example of adjacent patterns being connected in error due to an insufficient etching margin is that adjacent contact holes are connected due to an insufficient margin of the etching process for defining the contact holes. An example of patterns defined by different photomasks at the same level of an integrated circuit being connected in error due to insufficient alignment/etching margin is that an source/drain contact hole exposes a part of a gate due to an insufficient alignment margin of the exposure process and/or an insufficient margin of the etching process. The later two embodiments of this invention are OPC repairing procedures for the above cases of erroneous connection between adjacent patterns, intended to further explain this invention.

In next step 130, a repair procedure is performed only to the patterns failing to pass the process rule check so that each failed pattern can pass the process rule check. The repair procedure for a failed pattern may include the following steps. The graphic data of parts of an upper patterned layer and a lower patterned layer relating to the target patterned layer are retrieved, wherein the upper patterned layer and the lower patterned layer are respectively on and under the target patterned layer and the parts of the two related layers correspond to the failed pattern. Then, the arrangement of at least one adjacent pattern neighboring to the failed pattern in the integrated circuit is checked. A critical dimension and/or the position of the failed pattern is adjusted based on the graphic data of the parts of the upper and the lower patterned layers as well as the arrangement of the at least one adjacent pattern, wherein the adjustment to the critical dimension usually does not exceed 30% thereof.

In adjusting the critical dimension and/or the position of the failed pattern, it is preferred to consider the distance between the calculated projection contours of the failed pattern and the at least one adjacent pattern. If there is more than one adjacent patterns neighboring to the failed pattern in the integrated circuit, it is preferred to consider the distances at all angles between the calculated projection contour of the failed pattern and those of the adjacent patterns.

Thereafter, the patterns of the photomask are formed according to the corrected and repaired graphic data that have been subjected to the OPC and the repair procedure (step 140), which may be done with the follow steps. A photoresist layer is formed on an opaque layer on a glass substrate, and then an electron beam is used to form latent patterns in the photoresist layer under the control of a computer that is installed with the corrected and repaired graphic data. Then, development, etching, photoresist removal and cleaning are sequentially performed to finish the fabrication of the photomask.

Figure 2:
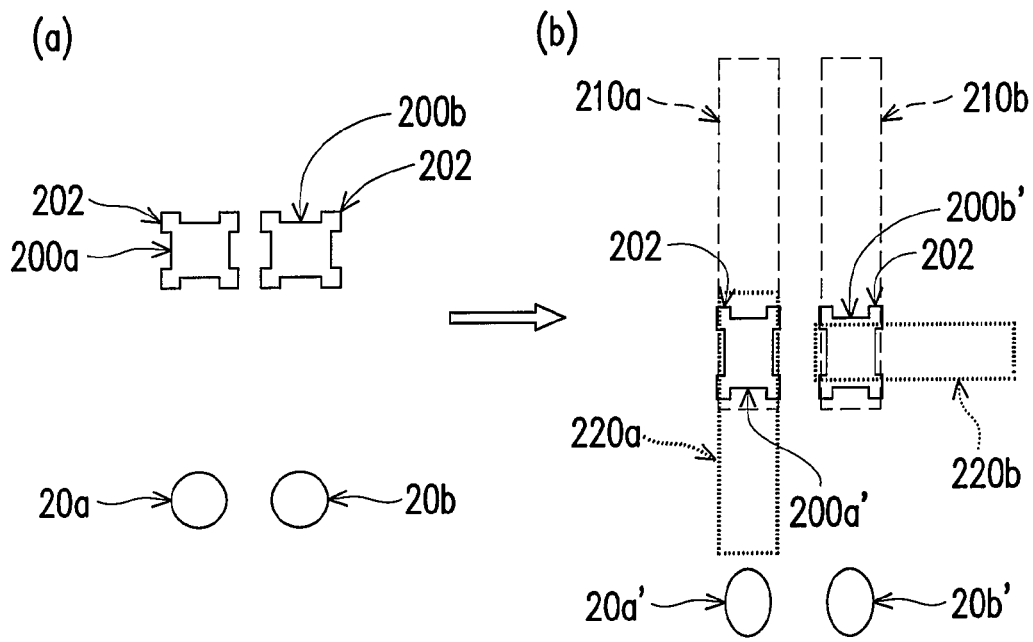
FIG. 2 illustrates an OPC repairing procedure according to an embodiment of this invention.

FIG. 2 illustrates an OPC repairing procedure according to an embodiment of this invention, which is applied to after-OPC contact hole patterns for defining contact holes in an interconnect process. Referring to FIG. 2A, two adjacent contact hole patterns 200a and 200b have been subjected to an OPC that added four serifs 202 respectively at four corners of each contact hole pattern 200a/b. In the subsequent process rule check, the projected contours 20a and 20b of the two corrected contact hole patterns 200a and 200b are obtained through numerical integration of a convolution formula, wherein the calculated projection contour of each contact hole pattern 200a/b is near circular for the pattern is near square.

For the projection contours 20a and 20b are not connected with each other, the contact hole patterns 200a and 200b pass the lithography rule check as a part of the process rule check. However, in the design rule check that considers the variables in the etching, it is predicted that the two corresponding contact holes formed through etching are possibly connect with each other due to an insufficient etching margin to make the contact plugs formed later shorted. Hence, at least one of the two contact hole patterns 200a and 200b has to be considered as a failed pattern, of which a critical dimension and/or a position has to be adjusted to increase the etching margin.

Referring to. FIG. 2(a)/(b), the repair procedure of this embodiment is as follows. The upper and lower patterned layers relating to the patterned layer with contact holes therein respectively include upper conductive lines and lower conductive lines that, are coupled via the contact plugs in the contact holes, and the parts of the upper and lower conductive lines corresponding to the contact hole patterns 200a and 200b include two lower conductive lines 210a and 210b and two upper conductive lines 220a and 220b. Hence, the graphic data of the parts of the two lower conductive lines 210a and 210b and the two upper conductive lines 220a and 220b are retrieved, wherein the upper conductive line 220b is orientated in the x-direction and the other conductive lines 210a, 210b and 220a in the y-direction.

Then, under the limitation that the overlap area of each contact plug (corresponding to 200a or 200b) with each of the upper and lower conductive lines (corresponding to 210a and 220a, or 210b and 220b) connected thereto has to be within a certain range for sufficiently low resistance, the x-directional critical dimension of each of the contact hole patterns 200a and 200b is decreased to increase the etching margin, while the y-directional critical dimension of the same is increased to maintain the cross-sectional area of the contact plug for sufficiently low resistance. The decrease in the x-directional critical dimension usually does not exceed 30% thereof, preferably 15% thereof. The increase in the y-directional critical dimension usually does not exceed 30% thereof, preferably 15% there of. Consequently, two corrected and repaired contact hole patterns 200a' and 200b' are obtained. Since each of the contact hole patterns 200a' and 200b' is near rectangular, it has a near elliptic projection contour 20a'/b' on the wafer.

In addition, in a case where the above line-contact-line interconnect structure is rotated by 90° so that the two contact hole patterns are arranged in the y-direction, the y-directional critical dimension has to be decreased while the x-directional one has to be, increased for the same reasons mentioned above. Moreover, though the two contact hole patterns 200a and 200b are both adjusted in the shape while their centers are not shifted in the above embodiment, it is possible to adjust the shape of only one of them and/or shift the center of at least one of them when the arrangement of the upper and lower conductive lines is changed, so that good connections between the contact plugs and the upper/lower conductive lines and a larger etching margin for adjacent contact holes are achieved simultaneously.

Figure 3A:
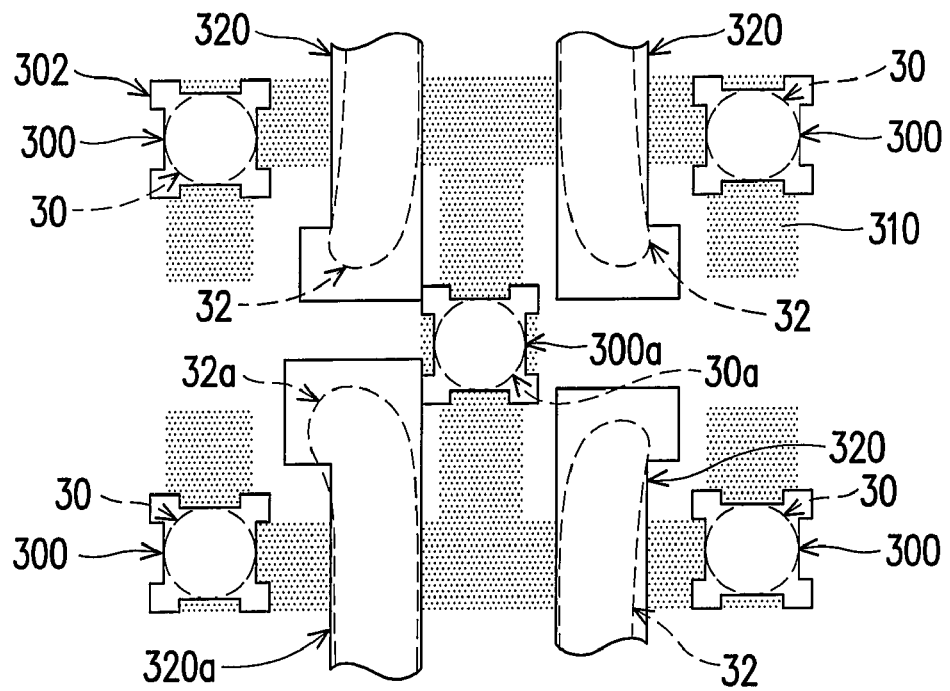
FIGS. 3A and 3B illustrate an OPC repairing procedure according to another embodiment of this invention.
Figure 3B:
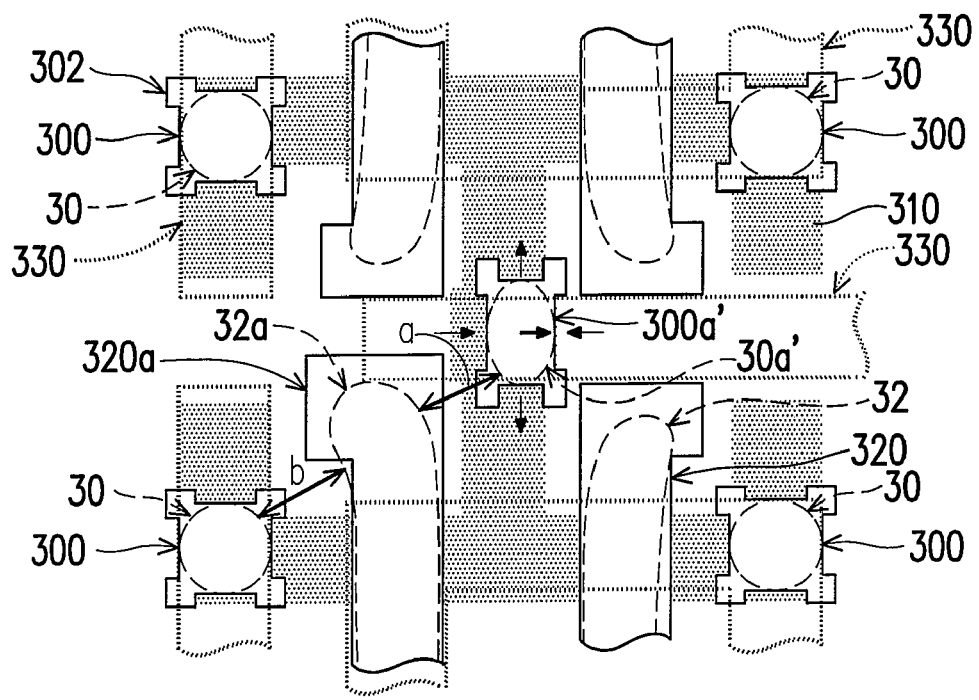

FIGS. 3A and 3B illustrate an OPC repairing procedure according to another embodiment of this invention, which is applied to after-OPC S/D contact hole patterns for defining contact holes in a static random access memory (SRAM) process.

Referring to FIG. 3A, the local layout structure of SRAM includes five contact plugs and four gate lines, wherein the contact holes containing the five contact plugs are defined by five contact hole patterns 300 on a photomask and the gate lines by four gate line patterns 320 on another photomask. An end of each gate line pattern 320 has been subjected to OPC so that the critical dimension of the corresponding end portion of the gate line defined by the gate line pattern 320 is not overly reduced, and has a contour approximately similar to the calculated projection contour 32. It is noted that the left lower gate line pattern 320a has a larger OPC pattern at its end for exemplifying the way to repair the failed contact hole pattern.

Before the repair procedure, four serifs are added to four corners of each contact hole pattern 300(a) in the OPC performed to the graphic data of the target photomask. In the subsequent process rule check, the projection contours 30(a) of all contact hole patterns 300(a) and projection contours 32(a) of all gate lines patterns 320 are derived through numerical integration, so as to check if there is any pair of contours 30 and 32 that are too close to provide a sufficient alignment/etching margin. The result of the check is that the calculated projection contour 30a of the central contact hole pattern 300a is too close to the calculated projection contour 32a of the left lower gate line pattern 320a, so that the central contact hole pattern 300a does not pass the process rule check and is a failed pattern.

Referring to FIGS. 3A and 3B, the OPC repair procedure of this embodiment is performed to the failed contact hole pattern 300a only. The upper patterned layer and the lower patterned layer, which are respectively on and under the patterned layer with S/D contact holes therein and related to the same, respectively include interconnect lines and active areas that are coupled via the contact plugs. Hence, the graphic data of the parts of the interconnect lines and the active areas corresponding to the contact hole pattern 300a that include an active area 310 and an interconnect line 330a are retrieved. Some other interconnect lines 330 near the interconnect line 330a corresponding to the other contact hole patterns 300 are also depicted for clarity.

Then, under the limitation that the overlap area of the contact plug corresponding to 300a with each of the active area 310 and interconnect line 330a connected thereto has to be within a certain range for sufficiently low resistance, the x-directional critical dimension of the contact hole pattern 300a is decreased and the center thereof shifted rightward slightly, so as to increase the distance between the projection contours 30a of the contact hole pattern 300a and that (32a) of the gate line pattern 320a and increase the alignment/etching margin thereby. Meanwhile, the y-directional critical dimension of the same is increased to maintain the cross-sectional area of the contact plug for sufficiently low conductance.

Moreover, the goal of this repair procedure may be that the distance (a) between the contour 30a and the contour 32 in any direction is equal to the distance (b) between the contour 32 and the contour 30 at the other side of the contour 32. To make the goal, the distances at all directions between the contour 30a of the contact hole pattern 300a and the contours 32(a) of the plurality of gate line patterns 320(a) have to be considered in the repair procedure. Moreover, in consideration of the lithographic resolution, the decrease in the x-directional critical dimension usually does not exceed 30% thereof, preferably 15% thereof. The increase in the y-directional critical dimension usually does not exceed 30% thereof, preferably 15% thereof. Consequently, an after-OPC and repaired contact hole pattern 300a' is obtained. Since the contact hole pattern 300a' is near rectangular, it has a near elliptic calculated projection contour 30a'.

Since the photomask manufacturing method of this invention performs a repair procedure only to the failed patterns not passing the process rule check but not adjust all patterns with another OPC recipe, the design of the photomask can be simplified to shorten the period needed for manufacturing the photomask.

Additionally, in the above embodiments where a critical dimension and/or a position of a failed pattern is adjusted in the repair procedure, the process margin is increased to improve the product yield.

This invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of manufacturing a photomask that is used in an integrated circuit (IC) process to define a first patterned layer of the integrated circuit, comprising:
    providing graphic data of the photomask;
    performing an optical proximity correction (OPC) to the graphic data;
    performing a process rule check to the graphic data with the OPC;
    when at least one failed pattern not passing the process rule check is found in the graphic data with the OPC, performing a repair procedure only to the failed pattern so that the failed pattern can pass the process rule check; and
    forming patterns of the photomask according to the graphic data that have been subjected to the OPC and the repair procedure,
    wherein the repair procedure comprises:
    retrieving graphic data of parts of an upper patterned layer and a lower patterned layer that are respectively over and under the first patterned layer in the integrate circuit and relate to the first patterned layer, the parts of the upper and lower patterned layers corresponding to the failed pattern;
    checking arrangement of at least one adjacent pattern neighboring to the failed pattern in the integrated circuit; and
    adjusting at least one of a critical dimension and a position of the failed pattern based on the graphic data of the parts of the upper and lower patterned layers and the arrangement of the at least one adjacent pattern.

2. The method of claim 1, wherein the adjustment to the critical dimension does not exceed 30% thereof.

3. The method of claim 1, wherein in adjusting at least one of the critical dimension and the position of the failed pattern, a distance between calculated projection contours of the failed pattern and the at least one adjacent pattern is considered.

4. The method of claim 3, wherein there is a plurality of adjacent patterns, and the distances at all angles between the calculated projection contour of the failed pattern and the calculated projection contours of the adjacent patterns are considered.

5. The method of claim 3, wherein the graphic data includes a plurality of contact hole patterns.

6. The method of claim 5, wherein the adjustment to a critical dimension of a failed contact hole pattern not passing the process rule check comprises: increasing an x-directional critical dimension of the same but decreasing a y-directional critical dimension of the same, or increasing the y-directional critical dimension of the same but decreasing the x-directional critical dimension of the same.

7. The method of claim 6, wherein the adjustment to the x- or y-directional critical dimension is within a range of ±30% thereof.

8. The method of claim 5, wherein the upper patterned layer and the lower patterned layer each comprises a plurality of conductive lines.

9. The method of claim 1, wherein the IC process further comprises using another photomask to form a second patterned layer at the same level of the first patterned layer of the integrated circuit, and the at least one adjacent pattern comprises a part of the second patterned layer, and
    the repair procedure further comprises retrieving graphic data of the part of the second patterned layer for deriving the arrangement of the at least one adjacent pattern.

10. The method of claim 9, wherein in adjusting at least one of the critical dimension and the position of the failed pattern, a distance between calculated projection contours of the failed pattern and the at least one adjacent pattern is considered.

11. The method of claim 10, wherein there is a plurality of adjacent patterns, and the distances at all angles between the calculated projection contour of the failed pattern and the calculated projection contours of the adjacent patterns are considered.

12. The method of claim 9, wherein
    the first patterned layer has a plurality of S/D contact holes therein, and the graphic data of the photomask include a plurality of S/D contact hole patterns;
    the lower patterned layer includes a plurality of active areas;
    the upper patterned layer includes a plurality of interconnect lines; and
    the second patterned layer includes a plurality of gates.

13. The method of claim 12, wherein the adjustment to a critical dimension of a failed SID contact hole pattern not passing the process rule check comprises: increasing an x-directional critical dimension of the same but decreasing a y-directional critical dimension of the same, or increasing the y-directional critical dimension of the same but decreasing the x-directional critical dimension of the same.

14. The method of claim 13, wherein the adjustment to the x- or y-directional critical dimension is within a range of ±30% thereof.

* * * * *